US011263365B2

(12) United States Patent
Meaige et al.

(10) Patent No.: US 11,263,365 B2
(45) Date of Patent: Mar. 1, 2022

(54) POST-AGING ADHESIVE TESTING

(71) Applicant: Honda Motor Co., Ltd., Tokyo (JP)

(72) Inventors: Benjamin J. Meaige, Powell, OH (US); Anthony J. Smith, Dublin, OH (US); Takakuni Hirayama, Utsunomiya (JP); Kishore K. Pydimarry, Dublin, OH (US)

(73) Assignee: HONDA MOTOR CO., LTD., Tokyo (JP)

( * ) Notice: Subject to any disclaimer, the term of this patent is extended or adjusted under 35 U.S.C. 154(b) by 429 days.

(21) Appl. No.: 16/270,839

(22) Filed: Feb. 8, 2019

(65) Prior Publication Data

US 2020/0257771 A1    Aug. 13, 2020

(51) Int. Cl.
| | |
|---|---|
| G06F 30/15 | (2020.01) |
| C09J 7/00 | (2018.01) |
| C09J 5/06 | (2006.01) |
| C09J 5/02 | (2006.01) |
| G06F 30/20 | (2020.01) |
| B62D 27/02 | (2006.01) |
| B62D 65/02 | (2006.01) |

(52) U.S. Cl.
CPC ............... G06F 30/15 (2020.01); C09J 5/02 (2013.01); C09J 5/06 (2013.01); C09J 7/00 (2013.01); G06F 30/20 (2020.01); B62D 27/026 (2013.01); B62D 65/02 (2013.01); C09J 2400/166 (2013.01)

(58) Field of Classification Search
CPC ... G06F 30/15; G06F 30/20; C09J 5/02; C09J 5/06; B62D 27/026; B62D 5/02
See application file for complete search history.

(56) References Cited

U.S. PATENT DOCUMENTS

| | | | |
|---|---|---|---|
| 7,745,006 B2 | 6/2010 | Barker | |
| 8,278,398 B2 | 10/2012 | Lutz et al. | |
| 9,840,070 B2 | 12/2017 | Jialanella et al. | |
| 2005/0022152 A1* | 1/2005 | Turk | G06F 30/15 717/100 |

(Continued)

FOREIGN PATENT DOCUMENTS

| | | |
|---|---|---|
| CN | 106092619 A | 11/2016 |
| WO | WO9623837 A2 | 8/1996 |

*Primary Examiner* — Thai Q Phan
(74) *Attorney, Agent, or Firm* — Rankin, Hill & Clark LLP

(57) ABSTRACT

A method of producing a vehicle includes determining the performance of aged adhesive coupons, which are subject to a worst-case scenario of manufacturing, aging, and stress testing. Virtual vehicle components are modeled using the performance of the aged adhesive coupons. The virtual vehicle components are then subjected to virtual mechanical forces to determine their virtual performance, which is then validated against the performance of identical real-life aged vehicle components subjected to identical mechanical forces. A virtual vehicle is modeled using the validated virtual vehicle components. The virtual performance of the virtual vehicle when subject to a virtual crash test is then compared against a predetermined standard, and the design of the virtual vehicle is considered feasible if its performance exceeds the predetermined standard. A vehicle is manufactured according to the feasible design of the virtual vehicle.

20 Claims, 5 Drawing Sheets

(56) References Cited

U.S. PATENT DOCUMENTS

| | | | |
|---|---|---|---|
| 2006/0080069 A1* | 4/2006 | Fujimoto | G06F 30/23 |
| | | | 703/2 |
| 2008/0195357 A1* | 8/2008 | Gustafson | G06F 30/23 |
| | | | 703/1 |
| 2008/0271542 A1* | 11/2008 | Schulz | B23D 51/01 |
| | | | 73/781 |
| 2012/0167981 A1 | 7/2012 | Yamaguchi et al. | |
| 2014/0147677 A1 | 5/2014 | Lutz et al. | |
| 2016/0103939 A1* | 4/2016 | Kumar | G06F 30/23 |
| | | | 703/1 |
| 2017/0002164 A1 | 1/2017 | Kohlstrung et al. | |
| 2021/0024142 A1* | 1/2021 | Saito | G06F 30/15 |

* cited by examiner

POST-AGING ADHESIVE TESTING

BACKGROUND

Welds are an established technology for joining metal parts on vehicles. Over the life of the vehicle, the welded joints age with exposure to the environment. The performance of the welded joints are affected during aging, by exposure to temperature and moisture variations. However, because welds have been used for so long in vehicle manufacturing, the performance of aged welded joints is well understood.

In vehicle manufacturing, welded joints can be replaced by adhesive joints. However, adhesive joints in vehicles and their performance when aged are not as well understood as welded joints. Therefore, the performance of a vehicle design including aged adhesive joints is not known.

BRIEF DESCRIPTION

According to one aspect, a method of determining the feasibility of a vehicle design includes providing an adhesive coupon including a first adhesive joint and aging the first adhesive joint. The aged first adhesive joint is subjected to a first mechanical force to determine a performance of the aged first adhesive joint. A computer model of a first virtual vehicle is prepared according to the vehicle design. The first virtual vehicle includes a first virtual adhesive joint having properties of the first adhesive joint before aging. The first virtual vehicle is subjected to a first simulated crash to determine a performance of the first virtual vehicle. A test vehicle having the vehicle design is subjected to a crash having properties of the first simulated crash to determine a performance of the test vehicle. The test vehicle includes a second adhesive joint having the properties of the first adhesive joint before aging. The method includes validating the performance of the first virtual vehicle with the performance of the vehicle. A computer model of a second virtual vehicle is prepared according to the vehicle design. The second virtual vehicle includes a second virtual adhesive joint having properties of the first adhesive joint after aging. The second virtual vehicle is subjected to a second simulated crash to determine a performance of the second virtual vehicle. The vehicle design is determined to be feasible if the performance of the second virtual vehicle exceeds a predetermined standard.

According to another aspect, a method of producing a vehicle includes preparing an adhesive coupon including a first adhesive joint and aging the first adhesive joint. A performance of the aged first adhesive joint is determined when subjected to a first mechanical force. A first virtual vehicle having a vehicle design is prepared, and includes a first virtual adhesive joint having properties of the first adhesive joint before aging. A performance of the first virtual vehicle is determined when subjected to a first simulated crash. The method includes subjecting a test vehicle having the vehicle design to a crash having properties of the first simulated crash to determine a performance of the test vehicle. The test vehicle includes a second adhesive joint having the properties of the first adhesive joint before aging. The performance of the first virtual vehicle is validated with the performance of the test vehicle. A computer model of a second virtual vehicle is prepared according to the vehicle design. The second virtual vehicle includes a second virtual adhesive joint having properties of the first adhesive joint after aging. The second virtual vehicle is subjected to a second simulated crash to determine a performance of the second virtual vehicle. If the performance of the second virtual vehicle exceeds a predetermined standard, then the method includes producing the vehicle according to the vehicle design, the vehicle including a third adhesive joint having properties of the first adhesive joint.

DETAILED DESCRIPTION

As welded joints are being replaced by adhesive joints in vehicles, there is a need to understand how physical and chemical properties of adhesively bonded structures may change over time when aged through exposure to various environmental conditions. The physical and chemical properties (also referred to herein as "properties") of the aged adhesive joints may determine their performances when subjected to mechanical force, e.g. in a crash.

Understanding the properties and the performances of aged adhesive joints when subjected to mechanical forces may allow the establishment of suitable design criteria for vehicles including such adhesive joints, and may allow for the design of countermeasures in the vehicle to accommodate for performance deterioration that may occur after aging of the adhesive joints. Modifying the properties of the adhesive joint, e.g. by making it bigger, including more adhesive joints, or using a stronger adhesive, may ensure that desired properties of the adhesive joint in the vehicle are maintained after years of use and environmental exposure of the vehicle. Such a modeling methodology may include preparation, aging, testing of the adhesive joints; modeling virtual vehicle components using data from testing the adhesive joints; validating the performance of the virtual vehicle components; modeling a virtual vehicle using the adhesive joints before aging; crash testing the virtual vehicle, modeling a test vehicle using the adhesive joints, crash testing the test vehicle, validating the performance of the virtual vehicle with the performance of the vehicle, modeling a second virtual vehicle using the validated virtual vehicle components or the aged first adhesive joints, and crash testing the second virtual vehicle in order to predict what the adhesive joint performance may be in a real-life production vehicle after years of usage and environmental exposure.

Figure 1:
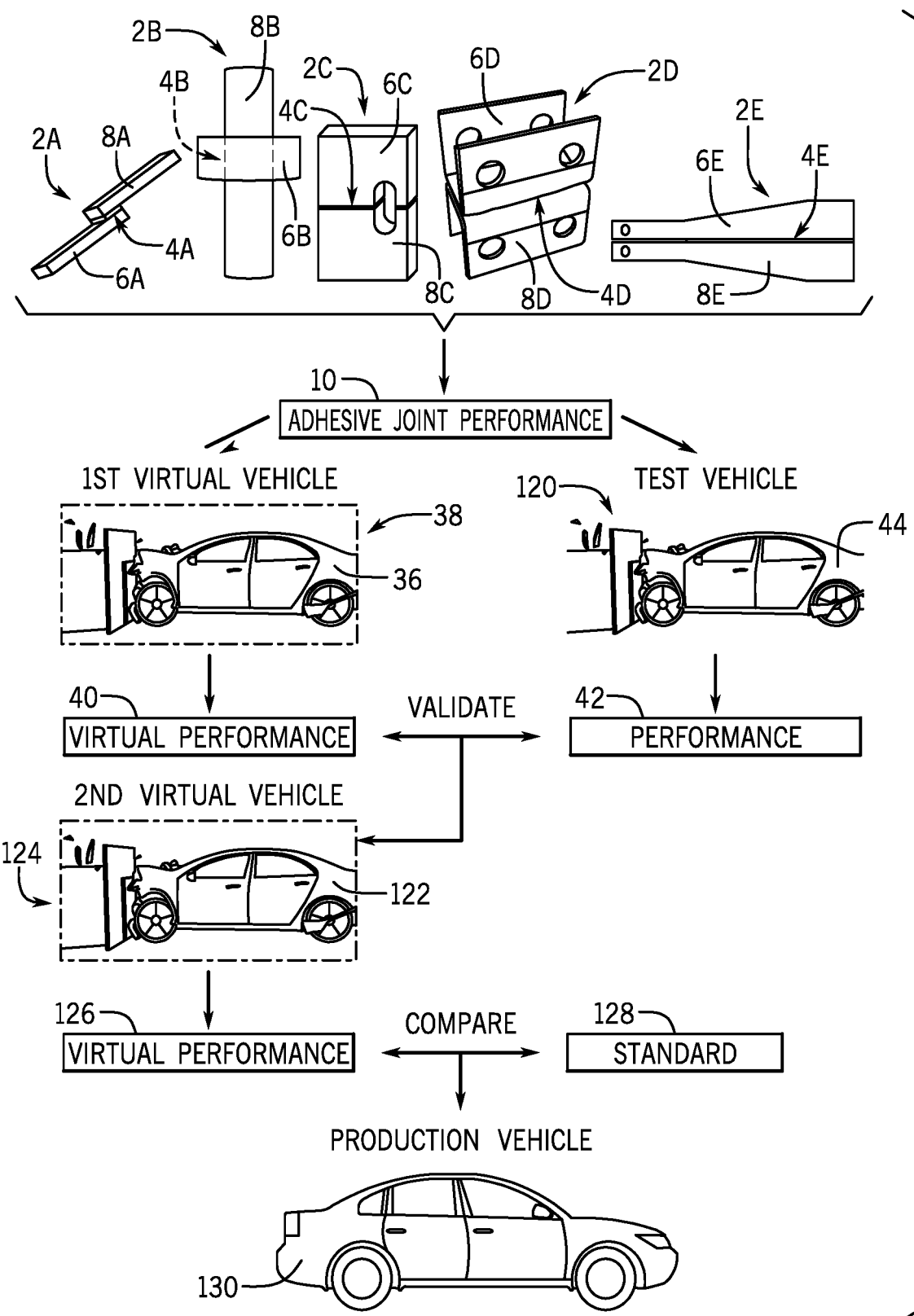
FIG. 1 is a schematic diagram of a method of producing a vehicle according to the present subject matter.

With reference to FIG. 1, a method may begin with one or more adhesive coupons 2 (also referred to as "test coupons" or "coupons"). The coupons 2 may include a single adhesive joint 4 that adhesively joins together two metal parts 6, 8. The adhesive joint 4 on each of the coupons 2 may be defined by the adhesive, and portions of the first and second metal parts 6, 8 that are in contact with the adhesive. As such, the properties of the adhesive joint 4 may be dependent on the properties of the adhesive, and portions of the first and second metal parts 6, 8 that are in contact with the adhesive. Likewise, the properties of the aged adhesive joint 4 and the performance of the aged adhesive joint 4 when subjected to a mechanical force, may be dependent on the properties of the aged adhesive, and portions of the aged first and second metal parts 6, 8 that are in contact with the aged adhesive.

The adhesive joint 4 can be of any known type used for joining two pieces of metal, and can include a butt joint, a scarf joint, a lap joint, a strap joint, a T-joint, a corner joint, an edge joint, a flange joint, a flange V-groove joint, etc., or combinations thereof.

As depicted in FIG. 1, coupons 2A-2E each include a first metal part 6A-6E adhesively bonded/joined at a single adhesive joint 4A-4E to a second metal part 8A-8E. Coupon 2A includes thick sheets as the first and second metal parts 6A, 8A connected by an adhesive lap joint 4A. Coupon 2B includes a pin and collar as the first and second metal parts 6B, 8B connected by adhesive joint 4B. Coupon 2C includes a rigid double cantilever beam as the first and second metal parts 6C, 8C connected by adhesive joint 4C. Coupon 2D includes a KS-2 coupon as the first and second metal parts 6D, 8D connected by adhesive joint 4D. Coupon 2E includes a tapered double cantilever beam as the first and second metal parts 6E, 8E connected by adhesive joint 4E. The present subject matter is not limited to the adhesive coupons 2A-2E depicted in FIG. 1, and it will be appreciated that other adhesive coupons 2 having different arrangements of first and second metal parts 6, 8 and an adhesive joint 4 can be used.

The adhesive coupons 2 can be prepared using known adhesive joint forming techniques, including by applying an uncured adhesive between the two metal parts 6, 8 and curing the adhesive to form the adhesive joint 4. The adhesive and the metal parts 6, 8 are not limited by the present subject matter, and the adhesive can include any of those known for adhesively bonding metal, and the metal parts 6, 8 can include various and combinations of metals including steel, aluminum, etc., and in various sizes and configurations.

In an embodiment, the adhesive coupons 2 are prepared under preparation conditions that may negatively impact the performance 10 (e.g. strength) of the adhesive joints 4. These preparation conditions for the adhesive coupons 2 may be modeled on worst-case manufacturing conditions, which may be worse than any manufacturing conditions that are likely to arise in a factory for manufacturing vehicles or parts thereof that include the adhesive joints 4. These preparation conditions may be part of a worst-case crash scenario involving a production vehicle 130 including such adhesive joints 4.

The preparation conditions for the adhesive coupons 2 may include i) applying a lubricant to a surface of one or more of the metal parts 6, 8 before applying the adhesive to the surface, and then applying an adhesive in an uncured state over the lubricant. The application of the lubricant may be based on worst-case manufacturing conditions, where the lubricant is used in stamping a metal vehicle component. The lubricant may be selected based on being the least compatible with the adhesive (e.g. allowing the least amount of adhesion between the cured adhesive and the metal parts 6, 8). The amount of the lubricant applied to the surface of the first and/or second metal parts 6, 8 may be at a coating amount of 0.5-20 grams per square meter, or 0.5-1.5 $g/m^2$, or 1.0 $g/m^2$. The lubricant may include aqueous lubricant such as brush polymers (polyethylene glycol), natural or synthetic oils, biolubricants, polytetrafluoroethylene (PTFE), graphite, or other material that is capable of reducing friction between two surfaces. The lubricant may be brushed on the surface and then allowed to rest from 1 minute to 48 hours (e.g. for 24 hours) while the surface remains horizontal to allow the lubricant to spread evenly across the surface, after which the uncured adhesive may be applied over the lubricant.

The preparation conditions for the adhesive coupons 2 may include after step i), then ii) subjecting the uncured adhesive for more than 12 hours (e.g. 24 hours) to an environment having a humidity level that is at or above 50% relative humidity (e.g. 75% relatively humidity) and a temperature of 30-50° C. (e.g. 40° C.). The environment may be based on worst-case manufacturing conditions, where the uncured adhesive is exposed to such an environment in a vehicle manufacturing factory before being cured and absorbing moisture from humid air. Such moisture absorption may negatively impact the performance of the adhesive joint 4 formed by the cured adhesive.

The preparation conditions for the adhesive coupons 2 may include after step ii), then iii) curing the adhesive to form the adhesive joint 4 between the first and second metal parts 6, 8. The adhesive can be cured in a variety of ways depending on the type of adhesive used, e.g. by heat curing, by chemical curing, by the addition of a curing initiator, etc. In a non-limiting embodiment, the adhesive includes a heat curing adhesive, where the adhesive is cured by heating the adhesive at least to a minimum cure temperature for at least a minimum cure time. The minimum cure temperature is the minimum temperature necessary to cure the adhesive. The minimum cure time is the minimum time necessary for heating the adhesive to the minimum cure temperature in order to cure the adhesive. The temperature to which the adhesive is heated for curing may be restricted to be no greater than 0-5° C. above the minimum temperature necessary to cure the adhesive. That is, the adhesive is not heated to a temperature greater than 0-5° C. above minimum cure temperature. In other words, the adhesive is heated at least to the minimum cure temperature but no higher than 5° C. above the minimum cure temperature. The amount of time that the adhesive is heated to cure may be restricted to be no greater than 0-5 minutes longer than a minimum amount of time necessary to cure the adhesive. That is, the adhesive is not heated for a time greater than 0-5 minutes longer than a minimum time necessary to cure the adhesive. In other words, the adhesive is heated at least to the minimum cure temperature for at least the minimum cure time, but not longer than 5 minutes more than the minimum cure time. In an embodiment, the adhesive is heated to a temperature of 150-220° C. (e.g. 160° C.) for a time of 10-90 minutes (e.g. 20 minutes). The heating temperature and time may be based on worst-case manufacturing conditions, where the adhesive is cured only to a minimum amount, which may negatively impact the performance of the adhesive joint 4 formed by the cured adhesive.

The preparation conditions for the coupons 2, which mimic worst-case manufacturing conditions, are not limited to any or all of steps i)-iii) being performed in order, and may include one or more of steps i)-iii), another order of performing steps i)-iii), and/or conditions or steps other than steps i)-iii).

The method may include exposing the coupons 2 including the adhesive joint 4 to an aging environment that approximates an expected worst-case real-word aging of the adhesive joint 4. This aging environment may be part of a worst-case crash scenario for the production vehicle 130. Putting the coupons 2 in an aging environment may expose the coupons to a humidity level, a temperature or a cycle of temperatures, a chemical (e.g. an acid or a salt), vibrations, UV radiation, etc., or combinations thereof that approximates an expected worst-case (i.e. most-extreme) real-world aging conditions during use of the production vehicle 130 including the adhesive joint 4. These characteristics of the aging environment may negatively impact the performance of the adhesive joint 4 after the aging process is completed. The coupons 2 may be exposed to the aging environment for longer than a predetermined time threshold.

The aging environment may be set at an elevated temperature that is above a predetermined temperature threshold, a reduced temperature that is below a predetermined temperature threshold, or may be set for a period of time at the elevated temperature and for a period of time at the reduced temperature. The aging environment may be set at an elevated humidity level above a predetermined humidity threshold. The aging environment may include a temperature and humidity controlled room. The predetermined time threshold, the predetermined temperature threshold, and the predetermined humidity threshold may be determined as a function of expected most-extreme conditions of use (e.g. expected duration of use of the vehicle, expected most-extreme temperature exposure, and expected most-extreme relative humidity exposure, respectfully) of the production vehicle 130 including the adhesive joint 4.

These thresholds may be determined using an Arrhenius equation and based on an expected life span of the production vehicle 130 before it is decommissioned (e.g. 12 years), and on data from the most-extreme environments on earth where the vehicle 130 could be used. The data may be taken from more than one environment on earth, including from a first environment with the most-extreme humidity level, and from a second environment with the most-extreme temperature (e.g. hottest environment or coldest environment on earth). The Arrhenius equation is then utilized to arrive at the predetermined time threshold, the predetermined temperature threshold, and the predetermined humidity threshold. In other words, these thresholds are based on the total amount of heat and humidity a vehicle 130 will see in its lifetime, and then accelerated using the Arrhenius model. For instance with respect to temperature, if over 12 years, the vehicle 130 is estimated to be exposed to 200 days at 50° C., 50 days at 60° C., 20 hours at 70° C., 8 hours at 80° C. and 30 minutes at 90° C., the Arrhenius method is used to calculate how many total hours at 90° C. are equivalent to all these temperature exposure levels. This calculation may be based on the reaction rates of the polymers in the adhesive joint 4 at each temperature, and accelerated to cover a lifetime of reactions in a matter of days. In an embodiment, all humidity and temperature inputs over the lifetime of the vehicle 130 can be calculated to be equivalent to 480 hours at 90° C. and 95% relative humidity. Other predetermined time, temperature, and humidity thresholds can be calculated.

The predetermined time threshold may be within a range of 100-1000 hours (e.g. 480 hours); the predetermined temperature threshold may be within a range of 70-100° C. (e.g. 90° C.), or −45° C. to −20° C.; and the predetermined humidity threshold may be within a range of 80-100% relative humidity (e.g. 95% relative humidity). The aging of the coupons 2 in the aging environment may negatively impact the performance of the adhesive joints 4 as extreme temperature and humidity may cause degradation of the adhesive joints 4. Alternatively, the predetermined time threshold, the predetermined temperature threshold, and the predetermined humidity threshold may be established at points where an amount of degradation of the aged adhesive joint 4 levels off even with further exposure to the aging environment. The degradation in the performance 10 of the aged adhesive joint 4 may be determined by being compared to the performance of the adhesive joint 4 without being aged and when subjected to a mechanical tests as described herein.

The aged coupons 2 are then subject to various mechanical tests that exert mechanical force on the aged coupons 2. The tests may cause failure (e.g. breaking) of the adhesive joint 4 by structural failure of the metal parts 6, 8, adhesive failure between the adhesive and one or more of the metal parts 6, 8, or cohesive failure within the adhesive itself.

Each aged coupon 2 may include only one aged adhesive joint 4, and the mechanical testing of the coupons 2 may therefore provide a fundamental performance (also referred to as "performance") 10 for each type of aged adhesive joint 4. The performance 10 of the aged adhesive joint 4 when subject to mechanical forces may indicate fundamental properties of the aged adhesive joints 4, such as for example, strength of the aged adhesive joints 4. This is because the fundamental properties of the aged adhesive joints 4 may determine the fundamental performances 10 of the aged adhesive joints 4 when subject to mechanical forces. The properties of the aged adhesive joints 4 may be a function of properties of the metal parts 6, 8 (e.g. their thickness, size, configuration, material composition, surface characteristics like roughness or smoothness, etc.), and properties of the adhesive (e.g. adhesive strength and cohesive strength, how much adhesive is used, the area of contact between the adhesive and the metal parts 6, 8, etc.).

The mechanical tests may include any known test for determining the performance 10 of the aged adhesive joints 4, including a fracture energy test, a KS-2 test, a tensile test, a peel test including a coach peel test or a T-peel test, a cantilever beam test, a double cantilever beam test including a tapered double cantilever beam test and a rigid double cantilever beam test, a shear test including a lap shear test including a thick-adherend lap shear test, a torsion test, an impact test, a torque test, a pin-and-collar test, a bulk tension test, a bulk shear test, a cleavage test including wedge impact peels, etc., or combinations thereof. These mechanical test may cause a dynamic mechanical deformation to the test coupons 2, and may determine a delamination resistance or other property of the aged adhesive joint 4.

When subjected to the mechanical tests, the aged adhesive joints 4 may be heated in a test environment to a temperature of 70-100° C. (e.g. 90° C. for example) or may be cooled in the test environment to a temperature of or −45° C. to −20° C. This heating of the aged adhesive joints 4 may be near the upper limits of the glass transition temperatures (Tg) of the adhesive in the aged adhesive joints 4, and may cause the adhesive to be in a viscous or rubbery state; while the cooling may cause the adhesive to become overly hard and brittle. This heating and cooling may approximate the worst-case crash scenario for a production vehicle 130 including such adhesive joints 4.

The aged adhesive joints 4 in the test coupons 2 may be monitored during the mechanical tests to determine their fundamental performances 10.

Once the fundamental performances 10 of the aged adhesive joints 4 are determined, a computer model of a first virtual vehicle 36 may be prepared according to a vehicle design that is desired for a production vehicle 130. The first virtual vehicle 36 may include a virtual adhesive joint having properties of the first adhesive joint 4 before aging. The first virtual vehicle 36 may be designed using known Computer Assisted Engineering (CAE) methods and tools. The first virtual vehicle 36 may be subjected to a simulated virtual crash 38 to determine a performance 40 of the first virtual vehicle 36.

The first virtual vehicle 36 may be designed based on the performances 10 of the adhesive joints 4. The first virtual vehicle 36 is not limited, and can have a design simulating any type of vehicle including land, sea, and air vehicles. As shown in FIG. 1 for example, the first virtual vehicle 36 is a passenger car. Other and additional vehicle designs can be prepared and tested.

The first virtual vehicle 36 may be designed and subjected to virtual crashes 38 using known Computer Assisted Engineering (CAE) methods and tools, which may provide the virtual performance 40 of the first virtual vehicle 36. The virtual crashes 38 may simulate a front impact, a side impact, a rear impact, or any other impact on the first virtual vehicle 36. The virtual performance 40 of the first virtual vehicle 36 may be dependent on the properties of the virtual adhesive joint that is included in the design of the first virtual vehicle 36.

The virtual performance 40 of the first virtual vehicle 36 may be compared to the performance 42 of a test vehicle 44 subjected to a crash test 120. The test vehicle 44 is a real-life vehicle having the vehicle design. The test vehicle 44 includes an adhesive joint having the properties of the adhesive joint 4 of the test coupon 2 before aging. In other words, the test vehicle 44 may be prepared according to the vehicle design of the first virtual vehicle 36, such that it has the same configuration as the first virtual vehicle 36. Having just been manufactured and thus not aged by being subjected to extended exposure to environmental conditions, the adhesive joints in the test vehicle 44 may have properties of the adhesive joints 4 in the test coupons 2 at a time before aging of the adhesive joints 4. The crash test 120 may have the same properties (e.g. force vectors, contact points, etc.) as the simulated crash 38. That is, the crash 120 may be of the same type (e.g. front impact crash test) and exert the same forces as those virtually exerted in the simulated crash 38. The performance 40 of the first virtual vehicle 36 is then validated with the performance 42 of the test vehicle 44.

The virtual performance 40 of the first virtual vehicle 36 may be validated by comparison to the performance 42 of the corresponding test vehicle 44. The virtual performance 40 may be validated if differences between the virtual performance 40 of the first virtual vehicle 36, and the performance 42 of the corresponding test vehicle 44 are within a predetermined threshold, e.g. if the performances 40, 42 match. If validated, the virtual performance 40 may be considered as accurately representing the actual performance 42.

If the virtual performance 40 of the first virtual vehicle 36 is validated, then a computer model of a second virtual vehicle 122 may be prepared according to the vehicle design. The second virtual vehicle 122 may include a virtual adhesive joint having properties of the aged first adhesive joint 4 (i.e. the first adhesive joint 4 after aging). The second virtual vehicle 122 may be designed using known Computer Assisted Engineering (CAE) methods and tools.

The second virtual vehicle 122 may be subjected to various types of computer simulated virtual crashes 124 or other virtual mechanical force to determine a virtual performance 126 of the second virtual vehicle 122. The virtual performance 126 of the second virtual vehicle 122 may be compared to one or more predetermined standards 128, which may include, but are not limited to, vehicle safety standards such as crash test safety standards, or manufacturing standards used in the industry of vehicle manufacturing corresponding to the type of virtual crash 124 is used. If the performance 126 of the second virtual vehicle 122 meets or exceeds the standards 128, then the vehicle design may be deemed feasible for the manufacture of the production vehicle 130, and the production vehicle 130 may then be produced.

If the performance 126 of the second virtual vehicle 122 does not meet or exceed the standards 128, then the vehicle design may be considered not feasible, and the vehicle design be adjusted to accommodate for the shortcomings with respect to the standards 128 and until the performance 126 of the second virtual vehicle 122 does meet or exceed the standards 128.

The method may exclude the making (i.e. Complete Build Up "CBU") of a real-life model of the vehicle design, and subsequent aging and crash testing of the real-life model. Instead, actual functioning production vehicles 130 based on the vehicle design can be made for selling to retail customers without aging and crash testing an aged CBU of the vehicle design. Not making and aging a CBU may save the cost, effort, and time that would otherwise be associated with the aging process and subsequent crash testing an aged real-life model of the aged vehicle.

Figure 2:
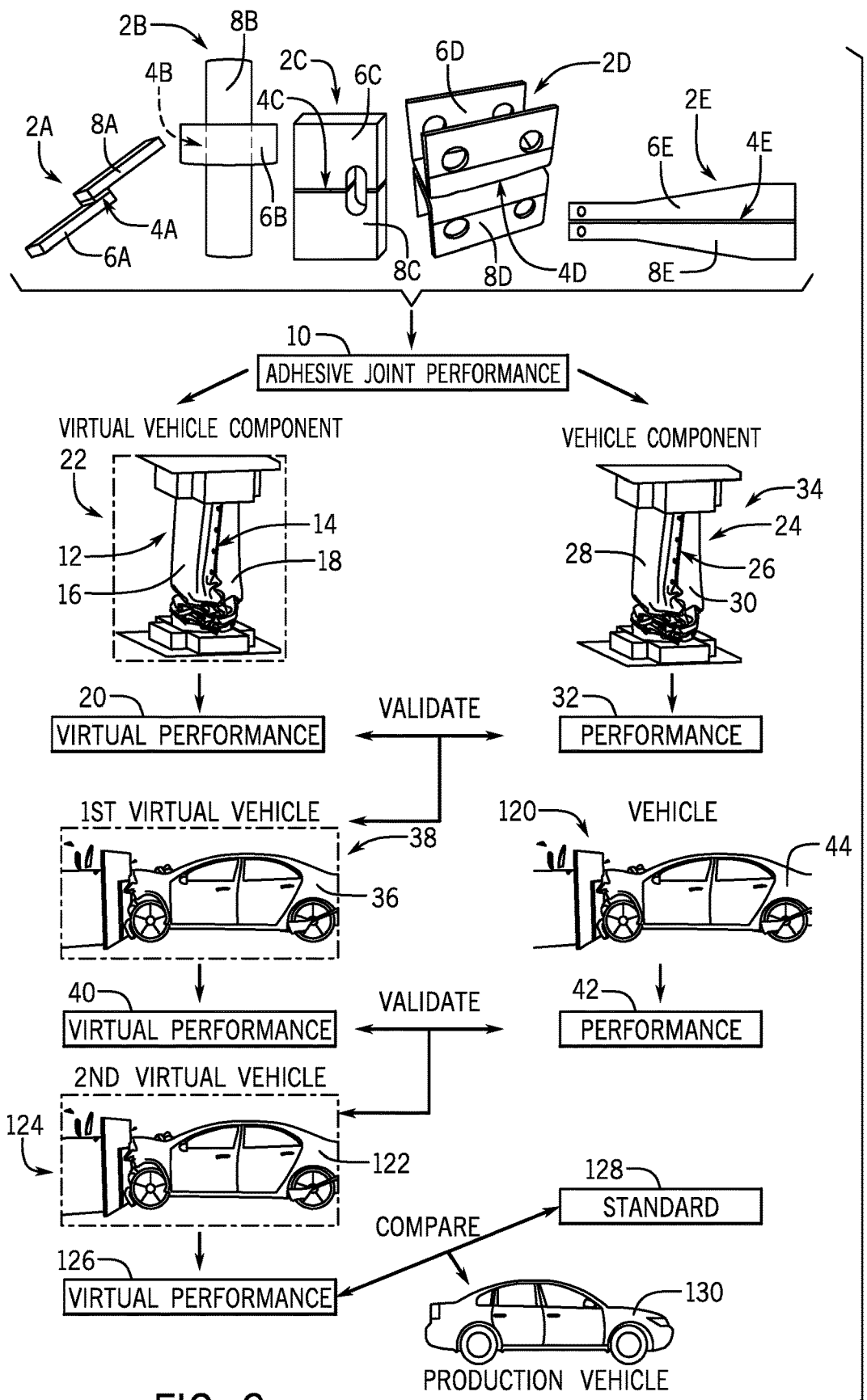
FIG. 2 is a schematic diagram of a method of producing a vehicle according to the present subject matter.

The method may also include validating the performance of virtual vehicle components with the performance of real vehicle components as shown in FIG. 2. That is, once the fundamental performances 10 of the aged adhesive joints 4 are determined, computer models of virtual vehicle components 12 may be prepared including virtual metal parts 16, 18 adhesively bonded by one or more virtual adhesive joints 14. The virtual vehicle components 12 may be designed using known Computer Assisted Engineering (CAE) methods and tools. The virtual vehicle components 12 are not limited, and can simulate any vehicle component that may be included in the production vehicle 130. The virtual vehicle components 12 may include one or more of, or portions of, a frame, unibody, chassis, a platform frame, an interior or exterior panel, or other vehicle parts; including open or closed columns, rails, braces, beams, channels, panels, or two or more of these components adhesively joined together. As shown in FIG. 2, the virtual vehicle component 12 includes for example, a virtual hollow column, which includes a virtual first metal part 16 and a virtual second metal part 18 adhesively bonded together at one or more virtual adhesive joints 14. Other and additional virtual vehicle components 12 can be used in the method.

The fundamental performances 10 of the aged adhesive joints 4 may be used as a basis to design the virtual vehicle components 12, which themselves may be subjected to computer simulated mechanical force 22 in order to ascertain their virtual performances 20. In other words, the performance 10 of the aged adhesive joints 4 may be taken into account when designing the virtual vehicle components 12, such that the virtual adhesive joint 14 has virtual properties (e.g. strength) that are a function of, or are based on, the properties (e.g. strength) of the aged adhesive joint 4. The performance 10 of the aged adhesive joints 4 may be extrapolated to arrive at a design for the virtual vehicle components 12. For instance, if an aged adhesive joint 4 (e.g. having a certain size by covering a certain area) has a particular performance 10 when subjected to the mechanical tests, then the virtual adhesive joint 14 having the same properties (e.g. same size) as the aged adhesive joint 4 would have a virtual performance 20 that is the same as the performance 10 of the aged adhesive joint 4.

If the design of a virtual vehicle component 12 were satisfactory when having the performance 10 provided by the aged adhesive joint 4, then the virtual adhesive joint 14 on the virtual vehicle component 12 may be designed to provide the same virtual performance 20 as the performance 10 provided by the aged adhesive joint 4.

However, if the design of a virtual vehicle component 12 requires an improved virtual performance 20 over that which is provided by the aged adhesive joint 4, then the virtual adhesive joint 14 on the virtual vehicle component 12 may be designed with enhanced properties (e.g. to be larger by covering more area) over those of the aged adhesive joint 4 in order to provide an improved virtual performance 20 than that provided by the aged adhesive joint 4. In this instance, properties of the virtual adhesive joint 14 (e.g. relative size compared to the aged adhesive joint 4) may be changed so as to provide the improved virtual performance 20. For instance, the virtual adhesive joint 14 may need to be stronger, and thus can be designed to be relatively bigger than the aged adhesive joint 4; or the virtual vehicle component 12 may include more than one of the virtual adhesive joints 14 or different types of virtual adhesive joints.

In another example where the design of a virtual vehicle component 12 can accommodate a reduced virtual performance 20 than the performance 10 provided by the aged adhesive joint 4 (e.g. where the aged adhesive joint 4 may be stronger than required by the design of the virtual vehicle component 12), then the virtual adhesive joint 14 may be designed to be smaller than the aged adhesive joint 4.

As such, the virtual adhesive joint 14 has properties of the aged adhesive joint 4, whether the properties of the virtual adhesive joint 14 are improved, the same as, or reduced compared to the properties of the aged adhesive joint 4. In other words, the properties of the virtual adhesive joint 14 are a function of the properties of the aged adhesive joint 4. Virtual properties of the virtual vehicle components 12, including properties of the virtual adhesive joints 14, may be populated with properties of the coupons 2, including properties of the adhesive joints 4, as determined by the mechanical tests.

The simulated mechanical force 22 is not limited, and may simulate any known mechanical force test, and may include a virtual three-point bend test, a virtual four-point bend test, a virtual column crush test, virtual dynamic T-joint tests including shear and peel tests, computer simulations of any of the mechanical tests used on the coupons 2, etc., or combinations thereof. As depicted in FIG. 1, the simulated mechanical forces 22 include for example, a virtual column crush test where the virtual vehicle component 12 is crushed along its length.

The virtual vehicle components 12 may be subjected to the virtual mechanical force 22 by using known CAE methods and tools. Subjecting the virtual vehicle components 12 to simulated mechanical force 22 may provide data indicating the virtual performances 20 of the virtual vehicle components 12. The data may indicate for example, a strength of the virtual adhesive joints 14, a resistance of the virtual vehicle components 12 to folding or bending or twisting, an amount of deformation of the virtual vehicle components 12, or other characteristic of the virtual vehicle components 12.

The virtual performances 20 of the virtual vehicle components 12 may then be validated. This may be accomplished by preparing corresponding vehicle components 24 having the same design as the virtual vehicle components 12, and including adhesive joints 26 having properties of the first adhesive joint 4. The vehicle components 24 are then aged and tested to determine their performances 32 when subjected to a mechanical force 34. The virtual performances 20 of the virtual vehicle components 12 are validated against the performances 32 of the corresponding vehicle components 24.

The vehicle components 24 may correspond to the virtual vehicle components 12 by each having a first metal part 28 having the same properties as the virtual properties of the virtual first metal part 16, and having a second metal part 30 having the same properties as the virtual properties of the virtual second metal part 18. The vehicle components 24 each also include the adhesive joint 26 having a configuration of the virtual adhesive joint 14. The adhesive joint 26 of each vehicle component 24 may be prepared under the same preparation conditions, and aged in the same aging environment, as described herein with respect to the adhesive joints 4 of the test coupons 2.

As shown in FIG. 1 for example, the vehicle component 24 includes a hollow column corresponding to the virtual hollow column of the virtual vehicle component 12. If other types of virtual vehicle components 12 are virtually tested, then corresponding vehicle components 24 having corresponding properties may also be tested.

The vehicle components 24 may be subjected to mechanical forces 34 that have the same properties (e.g. force vectors, contact points, etc.) as the virtual properties of the simulated mechanical force 22. As depicted in FIG. 2, the mechanical forces 34 includes a column crush test where the vehicle component 24 is crushed along its length, and that corresponds to the virtual column crush test performed on the virtual column. Other mechanical forces 34 may include, but are not limited to, a three-point bend test, a four-point bend test, dynamic T-joint tests including shear and peel tests, any of the mechanical tests used on the coupons 2, etc., or combinations thereof.

The performances 32 of the vehicle components 24 when subjected to the mechanical forces 34 may provide data indicating for example, a strength of the adhesive joints 26, a resistance of the vehicle components 24 to folding or bending or twisting, an amount of deformation of the vehicle components 24, or other characteristic of the vehicle components 24.

The virtual performances 20 of the virtual vehicle components 12 may then be validated by comparison to the performances 32 of corresponding vehicle components 24. The virtual performances 20 may be validated if differences between the virtual performances 20 of the virtual vehicle components 12 and the performances 32 of the corresponding vehicle components 24 are within predetermined threshold, e.g. if the performances match. If validated, the virtual performances 20 may be considered as accurately representing the actual performances 32. The predetermined thresholds used to validate the virtual performances 20 may correspond to the type of data obtained from testing the vehicle components 24 and virtual vehicle components 12.

If the virtual performances 20 of the virtual vehicle components 12 are validated, then the first virtual vehicle 36 may be prepared. The first virtual vehicle 36 may include one or more of the validated virtual vehicle components 12, but with a virtual adhesive joint having properties of the first adhesive joint 4 before aging. The second virtual vehicle 122 may include one or more of the validated virtual vehicle components 12, which includes one or more of the virtual adhesive joints 14, which has the same properties as the aged first adhesive joint 4.

The method may then proceed like as described for FIG. 1 in order to determine the feasibility of the vehicle design or to make a production vehicle 130 according to the vehicle design.

Figure 3:
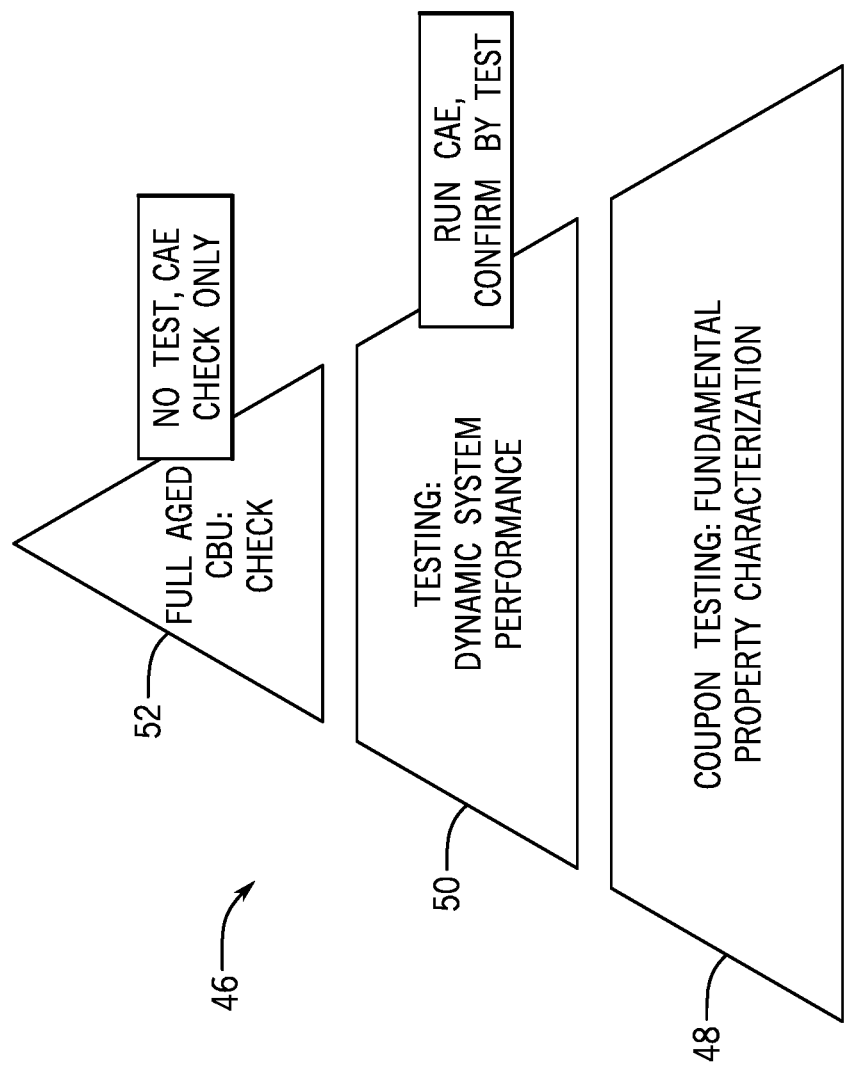
FIG. 3 is a pyramid method of determining the feasibility of a vehicle design according to the present subject matter.

With reference to FIG. 3, a pyramidal method 46 is shown to schematically depict a method of validating a vehicle design. At the base 48 of the pyramid, testing the aged coupons 2 is performed by aging and subjecting the coupons 2 to mechanical forces as described herein. Such testing allows for the determination of the fundamental performances 10 of the aged adhesive joints 4 in the various test coupons 2. At the middle 50 of the pyramid, both actual aged vehicle components 24 and virtual vehicle components 12 are tested, with CAE being used to construct and test the virtual vehicle components 12, and real-life tests being run on the aged vehicle components 24 as described herein. This process allows for the virtual performances 20 of the virtual vehicle components 12 to be validated against the performances 32 of the aged vehicle components 24 as described herein. If validated, then the performance 40 of the first virtual vehicle 36 may be validated with the performance 42 of the test vehicle 44. If this is validated, than at the top 52 of the pyramid a computer generated model of a second virtual vehicle 122 (i.e. virtual full CBU) is generated, which includes a virtual adhesive joint having properties of the first adhesive joint 4 after aging, and which is then subject to a virtual crash test 124 using CAE. The design of the second virtual vehicle 124 is considered feasible if the performance 126 exceeds the predetermined standards 128. The method 46 may exclude the making and testing of an aged real-life model of the test vehicle 44.

Figure 4:
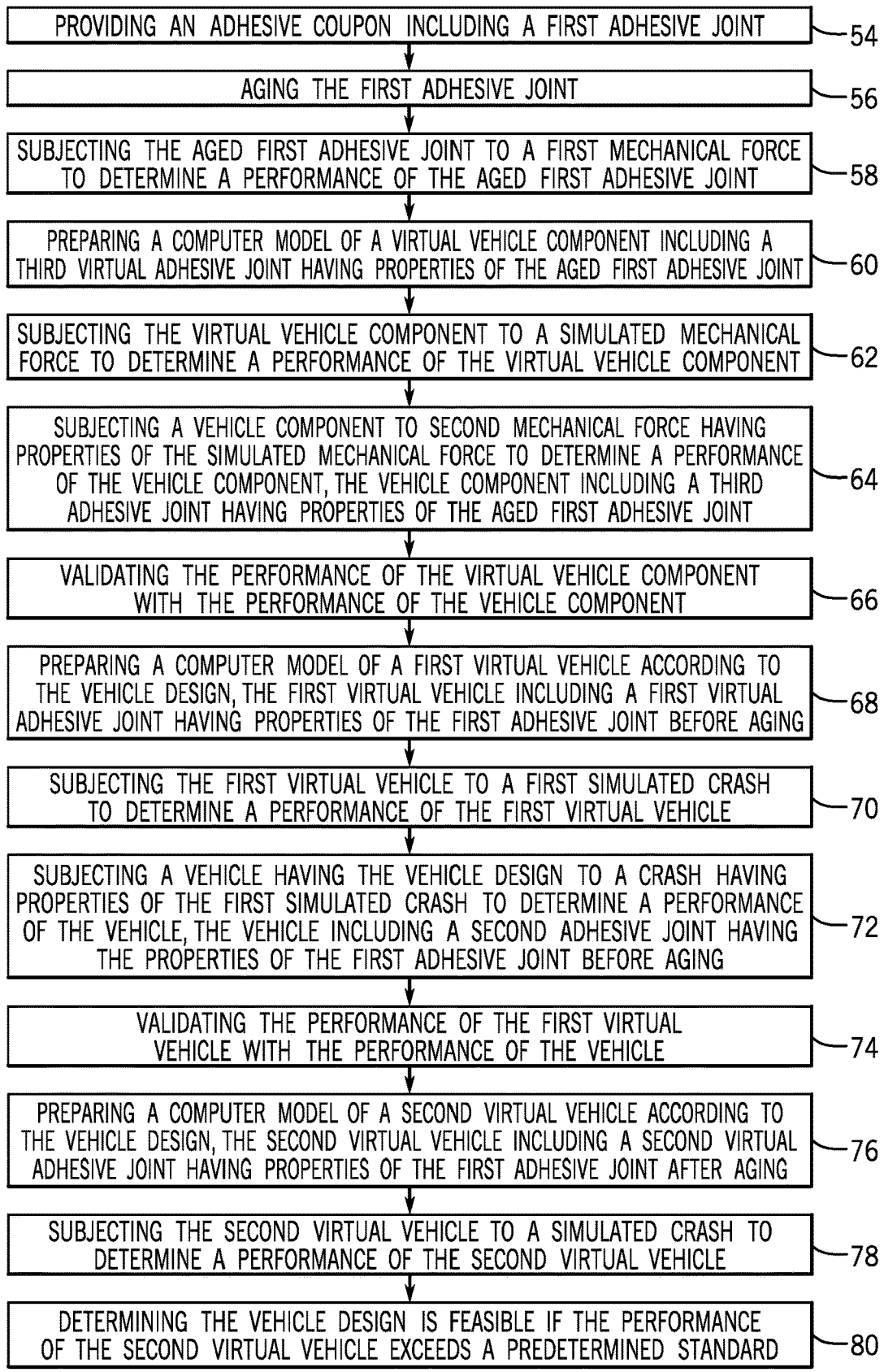
FIG. 4 is a method of determining the feasibility of a vehicle design according to the present subject matter.

With reference to FIG. 4, a method of determining the feasibility of a vehicle design includes at 54, preparing a test coupon 2 including a first adhesive joint 4. At 56, the first adhesive joint 4 is aged as described herein. Fundamental properties, e.g. strength, of the aged first adhesive joint 4 are determined at 58. Such properties may be indicated by the performance 10 of the aged adhesive joint 4 when subjected to mechanical force. At 68, the method includes preparing a computer model of a first virtual vehicle according to the vehicle design, the first virtual vehicle including a first virtual adhesive joint having properties of the first adhesive joint before aging. At 70, the first virtual vehicle is subjected to a first simulated crash to determine a performance of the first virtual vehicle. At 72, a vehicle having the vehicle design is subjected to a crash having properties of the first simulated crash, in order to determine a performance of the vehicle. The vehicle includes a second adhesive joint having the properties of the first adhesive joint before aging. At 74, the performance of the first virtual vehicle is validated with the performance of the vehicle. At 76, the method includes preparing a computer model of a second virtual vehicle according to the vehicle design, the second virtual vehicle including a second virtual adhesive joint having properties of the first adhesive joint after aging. The second virtual vehicle is subjected to a simulated crash to determine a performance of the second virtual vehicle at 78. The performance of the second virtual vehicle is compared to a predetermined standard. If the performance of the second virtual vehicle exceeds the predetermined standard, then at 80 the the vehicle design is considered feasible The method may further include at 60, preparing a computer model of a virtual vehicle component including a third virtual adhesive joint having properties of the aged first adhesive joint; and/or at 62, subjecting the virtual vehicle component to a simulated mechanical force to determine a performance of the virtual vehicle component; at 64, subjecting a vehicle component to second mechanical force having properties of the simulated mechanical force to determine a performance of the vehicle component, the vehicle component including a third adhesive joint having properties of the aged first adhesive joint, and/or at 66, validating the performance of the virtual vehicle component with the performance of the vehicle component, wherein the second virtual vehicle 122 includes the virtual vehicle component 12.

Figure 5:
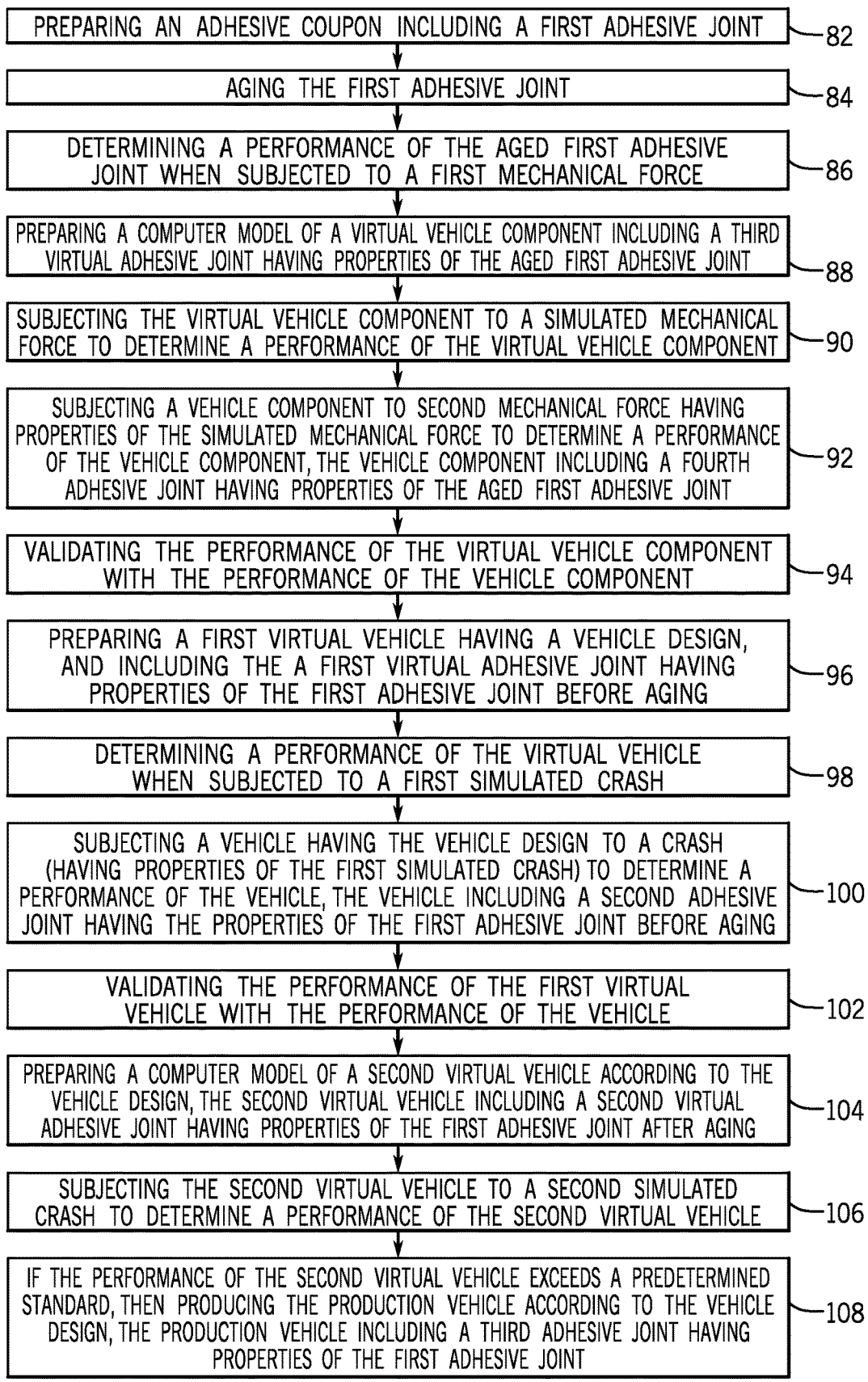
FIG. 5 is a method of producing a vehicle according to the present subject matter.

With reference to FIG. 5, a method of producing a vehicle includes at 82, preparing an adhesive coupon 2 including a first adhesive joint 4 and aging the first adhesive joint 4 at 84. A performance of the aged first adhesive joint 4 when subjected to a first mechanical force is determined at 86. At 96, a first virtual vehicle 36 is prepared including a first virtual adhesive joint having properties of the first adhesive joint 4 before aging. A performance 40 of the first virtual vehicle 36 is determined at 98 when subjected to a first simulated crash 38. At 100, a test vehicle 44 having the vehicle design is subjected to a crash 120 having properties of the first simulated crash 38 to determine a performance 42 of the test vehicle 44. The test vehicle 44 includes a second adhesive joint having the properties of the first adhesive joint 4 before aging. The method includes validating the performance 40 of the first virtual vehicle 36 with the performance 42 of the test vehicle 44 at 102. At 104 the method includes preparing a computer model of a second virtual vehicle 122 according to the vehicle design, the second virtual vehicle 122 including a second virtual adhesive joint having properties of the first adhesive joint 4 after aging. The method includes at 106, subjecting the second virtual vehicle 122 to a second simulated crash 124 to determine a performance 126 of the second virtual vehicle 122. At 108, if the performance 126 of the second virtual vehicle 122 exceeds a predetermined standard 128, then the method includes producing the production vehicle 130 according to the vehicle design, the production vehicle 130 including a third adhesive joint having properties of the first adhesive joint 4.

The method may further include at 88, preparing a virtual vehicle component 12 including a third virtual adhesive joint 14 having properties of the aged first adhesive joint 4; and/or at 90, subjecting the virtual vehicle component 12 to a simulated mechanical force to determine a performance of the virtual vehicle component 12; and/or at 92, subjecting a vehicle component 24 to a second mechanical force having properties of the simulated mechanical force, the vehicle component 24 including a fourth adhesive joint 26 having properties of the aged first adhesive joint 4; and/or at 92, validating the performance 20 of the virtual vehicle component 12 with the performance 32 of the vehicle component 24, wherein the second virtual vehicle includes the virtual vehicle component.

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of determining a feasibility of a vehicle design:
    providing an adhesive coupon including a first adhesive joint;
    aging the first adhesive joint;
    subjecting the aged first adhesive joint to a first mechanical force to determine a performance of the aged first adhesive joint;
    preparing a computer model of a first virtual vehicle according to the vehicle design, the first virtual vehicle including a first virtual adhesive joint having properties of the first adhesive joint before aging;
subjecting the first virtual vehicle to a first simulated crash to determine a performance of the first virtual vehicle;
subjecting a vehicle having the vehicle design to a crash having properties of the first simulated crash to determine a performance of the vehicle, the vehicle including a second adhesive joint having the properties of the first adhesive joint before aging;
validating the performance of the first virtual vehicle with the performance of the vehicle;
preparing a computer model of a second virtual vehicle according to the vehicle design, the second virtual vehicle including a second virtual adhesive joint having properties of the first adhesive joint after aging;
subjecting the second virtual vehicle to a second simulated crash to determine a performance of the second virtual vehicle; and
determining the vehicle design is feasible if the performance of the second virtual vehicle exceeds a predetermined standard.

2. The method of claim 1, wherein:
the adhesive coupon includes a first metal part adhesively bonded at the first adhesive joint to a second metal part; and
the adhesive coupon is provided by applying a lubricant to a surface of one or more of the first metal part and the second metal part, then applying an adhesive in an uncured state over the lubricant, and then curing the adhesive to form the first adhesive joint between the first metal part and the second metal part.

3. The method of claim 2, wherein after applying the adhesive over the lubricant and before curing the adhesive, the adhesive is exposed for more than 12 hours to an environment having a humidity level at or above 50% relative humidity and a temperature of 30-50° C.

4. The method of claim 2, wherein:
the adhesive is cured by heating the adhesive;
the adhesive is not heated to a temperature greater than 0-5° C. above a minimum temperature necessary to cure the adhesive; and
the adhesive is not heated for a time greater than 0-5 minutes longer than a minimum time necessary to cure the adhesive.

5. The method of claim 1, wherein the first adhesive joint is aged for longer than a predetermined time threshold by heating the first adhesive joint above a predetermined temperature threshold, and by subjecting the first adhesive joint to a humidity above a predetermined humidity threshold.

6. The method of claim 5, wherein:
the predetermined time threshold is within a range of 100-1000 hours;
the predetermined temperature threshold is within a range of 70-100° C.; and
the predetermined humidity threshold is within a range of 80-100% relative humidity.

7. The method of claim 5, wherein the predetermined time threshold, the predetermined temperature threshold, and the predetermined humidity threshold are each determined as a function of expected most-extreme conditions of use of a production vehicle having the vehicle design.

8. The method of claim 7, wherein the predetermined time threshold, the predetermined temperature threshold, and the predetermined humidity threshold are each determined using an Arrhenius equation.

9. The method of claim 1, wherein a temperature of the adhesive coupon is 70-100° C. when the aged first adhesive joint subjected to the first mechanical force.

10. The method of claim 1, further including:
preparing a computer model of a virtual vehicle component including a third virtual adhesive joint having properties of the aged first adhesive joint;
subjecting the virtual vehicle component to a simulated mechanical force to determine a performance of the virtual vehicle component;
subjecting a vehicle component to second mechanical force having properties of the simulated mechanical force to determine a performance of the vehicle component, the vehicle component including a third adhesive joint having properties of the aged first adhesive joint; and
validating the performance of the virtual vehicle component with the performance of the vehicle component;
wherein the second virtual vehicle includes the virtual vehicle component.

11. The method of claim 10, wherein a temperature of the vehicle component is 70-100° C. when the vehicle component is subjected to the second mechanical force.

12. A method of producing a vehicle comprising:
preparing an adhesive coupon including a first adhesive joint;
aging the first adhesive joint;
determining a performance of the aged first adhesive joint when subjected to a first mechanical force;
preparing a first virtual vehicle having a vehicle design, and including a first virtual adhesive joint having properties of the first adhesive joint before aging;
determining a performance of the first virtual vehicle when subjected to a first simulated crash;
subjecting a test vehicle having the vehicle design to a crash having properties of the first simulated crash to determine a performance of the test vehicle, the test vehicle including a second adhesive joint having the properties of the first adhesive joint before aging;
validating the performance of the first virtual vehicle with the performance of the test vehicle;
preparing a computer model of a second virtual vehicle according to the vehicle design, the second virtual vehicle including a second virtual adhesive joint having properties of the first adhesive joint after aging;
subjecting the second virtual vehicle to a second simulated crash to determine a performance of the second virtual vehicle; and
if the performance of the second virtual vehicle exceeds a predetermined standard, then producing the vehicle according to the vehicle design, the vehicle including a third adhesive joint having properties of the first adhesive joint.

13. The method of claim 12, wherein:
the adhesive coupon includes a first metal part adhesively bonded at the first adhesive joint to a second metal part; and
the adhesive coupon is provided by applying a lubricant to a surface of one or more of the first metal part and the second metal part, then applying an adhesive in an uncured state over the lubricant, then exposing the adhesive for 12-36 hours to an environment having a humidity level at or above 50% relative humidity and a temperature of 30-50° C., and then curing the adhesive to form the first adhesive joint between the first metal part and the second metal part.

14. The method of claim 13, wherein:
the adhesive is cured by heating; and
the adhesive is not heated to a temperature greater than 0-5° C. above a minimum temperature necessary to cure the adhesive; and
the adhesive is not heated for a time greater than 0-5 minutes longer than a minimum time necessary to cure the adhesive.

15. The method of claim 12, wherein the first adhesive joint is aged for a time of 100-1000 hours by heating the first adhesive joint to a temperature of 70-100° C. and subjecting the first adhesive joint to a relative humidity of 80-100%.

16. The method of claim 15, wherein:
the time is determined as a function of an expected duration of use of the vehicle;
the temperature is determined as a function of an expected most-extreme temperature exposure of the vehicle during the duration of use of the vehicle; and
the relative humidity is determined as a function of an expected most-extreme relative humidity exposure of the vehicle during the duration of use of the vehicle.

17. The method of claim 12, wherein the first adhesive joint includes a butt joint, a scarf joint; a lap joint, a strap joint, a T-joint, a corner joint, an edge joint, a flange joint, a flange V-groove joint, or combinations thereof.

18. The method of claim 12, wherein the first mechanical force includes a fracture energy test, a KS-2 test, a tensile test, a peel test including a coach peel test or a T-peel test, a cantilever beam test, a double cantilever beam test including a tapered double cantilever beam test and a rigid double cantilever beam test, a shear test including a lap shear test including a thick-adherend lap shear test, a torsion test, an impact test, a torque test, a pin-and-collar test, a bulk tension test, a bulk shear test, a cleavage test including wedge impact peels, or combinations thereof.

19. The method of claim 12, wherein:
a temperature of the adhesive coupon is 70-100° C. when the performance of the adhesive coupon is determined; and
a temperature of the vehicle component is 70-100° C. when the performance of the vehicle component is determined.

20. The method of claim 12, further including:
preparing a computer model of a virtual vehicle component including a third virtual adhesive joint having properties of the aged first adhesive joint;
subjecting the virtual vehicle component to a simulated mechanical force to determine a performance of the virtual vehicle component;
subjecting a vehicle component to second mechanical force having properties of the simulated mechanical force to determine a performance of the vehicle component, the vehicle component including a fourth adhesive joint having properties of the aged first adhesive joint; and
validating the performance of the virtual vehicle component with the performance of the vehicle component;
wherein the second virtual vehicle includes the virtual vehicle component; and
wherein a temperature of the vehicle component is 70-100° C. when the vehicle component is subjected to the second mechanical force.

* * * * *